(12) United States Patent
Cheng et al.

(10) Patent No.: US 7,428,777 B2
(45) Date of Patent: Sep. 30, 2008

(54) METHOD OF MAKING A HEATSINK DEVICE

(75) Inventors: Kai Yong Cheng, Penang (MY); Chew Keat Lim, Kedah (MY); Teik Hua Ng, Perak (MY)

(73) Assignee: Intel Corporation, Santa Clara, CA (US)

(*) Notice: Subject to any disclaimer, the term of this patent is extended or adjusted under 35 U.S.C. 154(b) by 275 days.

(21) Appl. No.: 11/168,616

(22) Filed: Jun. 28, 2005

(65) Prior Publication Data
US 2005/0255646 A1 Nov. 17, 2005

Related U.S. Application Data

(62) Division of application No. 10/610,348, filed on Jun. 30, 2003, now Pat. No. 6,937,473.

(51) Int. Cl.
*H01R 43/00* (2006.01)
*B22F 7/00* (2006.01)
*H01L 21/00* (2006.01)

(52) U.S. Cl. ............................... 29/825; 29/832; 29/840; 361/683; 419/6; 438/122

(58) Field of Classification Search ................... 29/825, 29/832, 840; 361/683; 419/6; 438/122
See application file for complete search history.

(56) References Cited

U.S. PATENT DOCUMENTS

| | | | |
|---|---|---|---|
| 5,413,751 A * | 5/1995 | Polese et al. ................... 419/23 |
| 5,673,174 A | 9/1997 | Hamirani ..................... 361/686 |
| 5,972,737 A * | 10/1999 | Polese et al. ................. 438/122 |
| 6,015,008 A | 1/2000 | Kogure et al. |
| 6,183,874 B1 * | 2/2001 | Yamagata et al. ............ 428/472 |
| 6,196,298 B1 | 3/2001 | Shaw |
| 6,250,127 B1 * | 6/2001 | Polese et al. ................... 72/256 |
| D450,306 S | 11/2001 | Lin et al. |
| 6,418,020 B1 | 7/2002 | Lin |
| D464,939 S | 10/2002 | Chuang et al. |
| 6,462,413 B1 * | 10/2002 | Polese et al. ................. 257/732 |
| 6,505,680 B1 | 1/2003 | Hegde |
| 6,534,190 B1 * | 3/2003 | Yamagata et al. ............ 428/472 |
| 6,569,524 B2 * | 5/2003 | Kawai et al. ................. 428/375 |
| 6,671,172 B2 | 12/2003 | Carter et al. |
| 6,714,415 B1 | 3/2004 | Shah |
| 7,047,639 B1 * | 5/2006 | Sheen .................... 29/890.032 |
| 2003/0024693 A1 | 2/2003 | Petty et al. |
| 2004/0264134 A1 | 12/2004 | Cheng et al. |

OTHER PUBLICATIONS

Research Disclosure "Thermal Cap with Direct Heat Sink" (Published Sep. 1986) Research Disclosure Database No. 269021, Research Disclosure Journal No. 26921.

* cited by examiner

*Primary Examiner*—C. J Arbes
(74) *Attorney, Agent, or Firm*—Schwegman, Lundberg & Woessner, P.A.

(57) ABSTRACT

A method and device for thermal conduction is provided. Methods of forming heatsinks are provided that include advantages such as the ability to produce intricate detailed features that other manufacturing methods are not capable of. Other advantages provided include a reduction in process time and cost due to the absence of a need to machine components after initial fabrication. Embodiments of heatsinks that are formed using methods provided include features such as sub-fins and other detailed features that cannot be formed using other manufacturing processes. Further embodiments of heatsinks that are formed using methods provided include materials that cannot be formed using other manufacturing processes.

8 Claims, 6 Drawing Sheets

METHOD OF MAKING A HEATSINK DEVICE

RELATED APPLICATION(S)

This application is a Divisional of U.S. application Ser. No. 10/610,348 filed Jun. 30, 2003 now U.S Pat. No. 6,937,473, which is incorporated herein by reference.

TECHNICAL FIELD

The present invention relates generally to the field of heat transfer and, in particular, the present invention relates to thermal management of electronic devices.

BACKGROUND

In one aspect of heat transfer technology, heatsinks are used to transfer heat generated by electronic devices or groups of devices, such as transistors, as are commonly included on integrated circuit (IC) chips such as processor chips.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

With the advent of high performance IC's and their associated packages, electronic devices have required more innovative thermal management to dissipate heat. Increasing speed and power in processors, for example, generally carry with it a "cost" of increased heat in the microelectronic die that must be dissipated. What is needed is a device and method to more effectively cool microelectronic dies containing IC's such as processors. What is also needed is a device and method that is less expensive and easier to manufacture.

DETAILED DESCRIPTION

Figure 1:
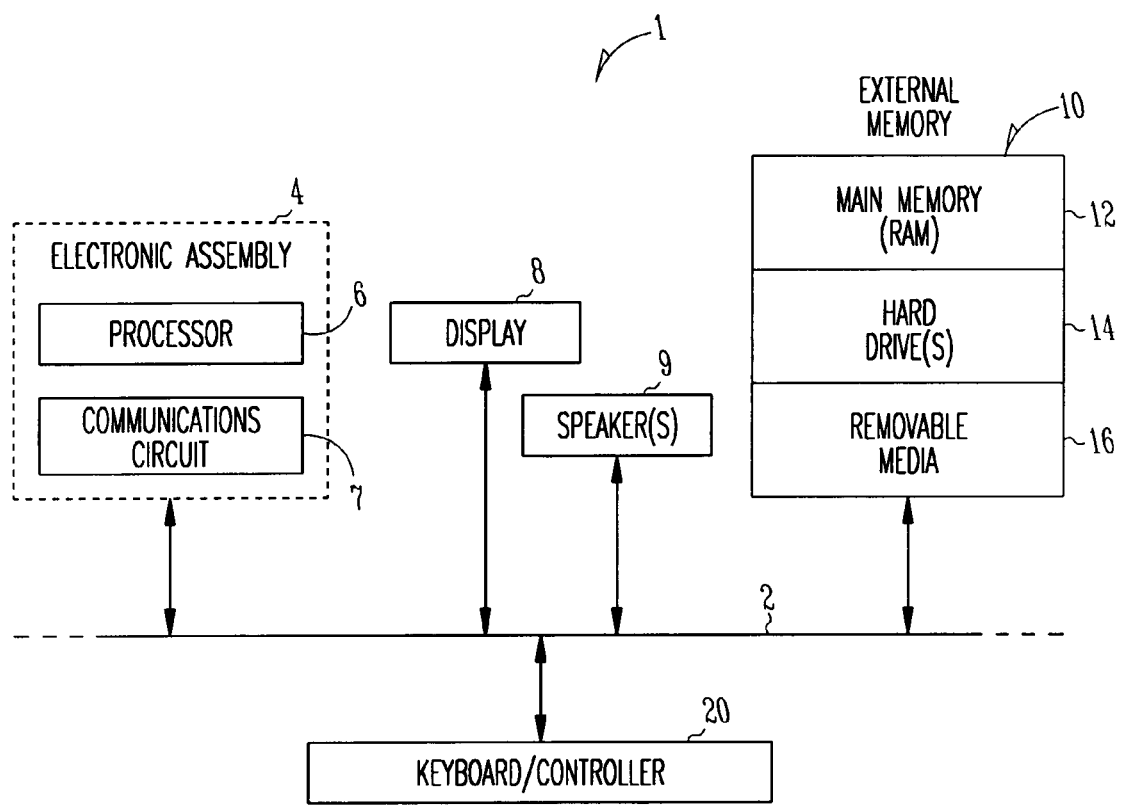
FIG. 1 illustrates an information handling device according to one embodiment of the invention.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the invention should be determined with reference to the appended claims, along with the full scope of equivalents to which such claims are entitled.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that generally does not contain active devices on its surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

An example of an information handling system using processor chips and thermal management devices is included to show an example of a higher level device application for the present invention. FIG. 1 is a block diagram of an information handling system 1 incorporating at least one heatsink in accordance with at least one embodiment of the invention. Information handling system 1 is merely one example of an electronic system in which the present invention can be used. In this example, information handling system 1 comprises a data processing system that includes a system bus 2 to couple the various components of the system. System bus 2 provides communications links among the various components of the information handling system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Information handling system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CD), digital video disk (DVD), and the like. Examples of main memory 12 include dynamic random access memory (DRAM), synchronous dynamic random access memory (SDRAM), double data rate synchronous dynamic random access memory (DDR SDRAM), rambus dynamic random access memory (RDRAM), flash memory, static random access memory (SRAM), etc.

Information handling system 1 can also include a display device 8, one or more speakers 9, and a keyboard and/or controller 20, which can include a mouse, trackball, game controller, voice-recognition device, or any other device that permits a system user to input information into and receive information from the information handling system 1.

Although the present invention is found to be effective at transferring heat from IC surfaces, the invention is not limited to heat transfer from IC surfaces. The invention can be used in any setting where heat is to be conducted from one surface to another. For ease of explanation, the example of cooling an IC will be used.

Figure 2A:
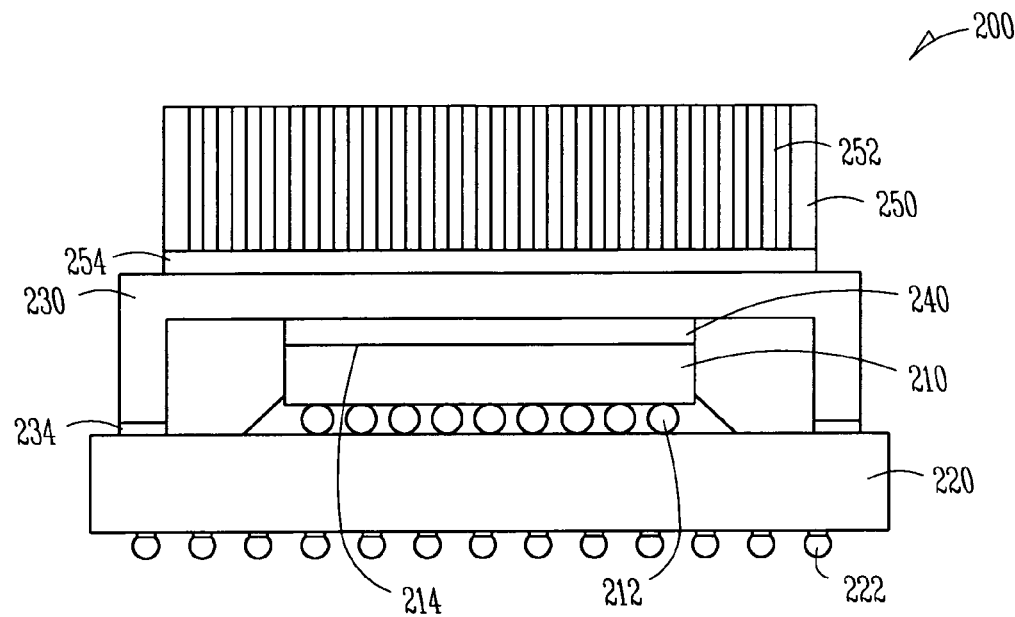
FIG. 2A illustrates a side view of a processor assembly according to one embodiment of the invention.

FIG. 2A shows a cross-sectional representation of a chip assembly 200. In embodiments where the chip is a processor die, the chip assembly can be termed a processor assembly. Chip assembly 200 includes an IC die 210 mounted in "flip-chip" orientation with its active side facing downward to couple with an upper surface of a substrate 220, such as a circuit board, through solder balls or bumps 212. Substrate 220 can be a one-layer board or a multi-layer board, and it can include additional contacts 222 on its opposite surface for mating with additional packaging structure (not shown).

Die 210 generates its heat from internal structure, including wiring traces, that is located near its active side; however, a significant portion of the heat is dissipated through its back side 214. Heat that is concentrated within the die is dissipated to a large surface that is in contact with the die in the form of an integrated heat spreader 230 that is typically formed of metal such as copper or aluminum. In one embodiment, the integrated heat spreader 230 is formed into a partial enclosure, and serves as a package cover for the die 210. In one embodiment, a sealant 234 is further included to isolate and secure the integrated heat spreader 230 to the substrate 220. To improve the thermal conductivity between the die 210 and the integrated heat spreader 230, a thermal interface material 240 is often provided between the die 210 and integrated heat spreader 230.

In one embodiment, to further dissipate heat from the integrated heat spreader 230, a heatsink 250 optionally having fins 252 is coupled to the integrated heat spreader 230. Heatsink 250 dissipates heat into the ambient environment. In one embodiment a second thermal interface material 254 is further utilized to create a thermal pathway between the integrated heat spreader 230 and the heatsink 250. In one embodiment, a device such as a fan is connected adjacent to the heatsink 250 to circulate air and more effectively transfer heat away from the die 210.

The heatsink 250 shown in FIG. 2A is intended to be a general illustration of a heatsink. In the following detailed description, specific details of heatsinks and assemblies are illustrated for given embodiments of the invention.

Figure 2B:
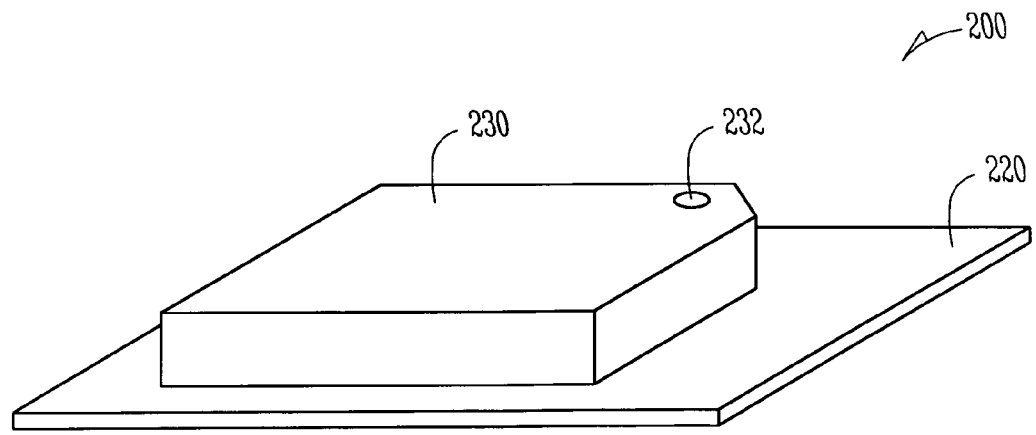
FIG. 2B illustrates an isometric view of a processor assembly according to one embodiment of the invention.

FIG. 2B shows an embodiment of an chip assembly 200 without an additional heatsink 250 attached as described above. The integrated heat spreader 230 is shown in an embodiment formed as a package cover. The edges of the integrated heat spreader 230 form an enclosure with the substrate 220 where the die (not shown) is substantially enclosed. In one embodiment, an opening 232 is included in the integrated heat spreader 230. In one embodiment, the opening 232 provides a relief for variations in pressure due to thermal changes in the die.

Figure 3:
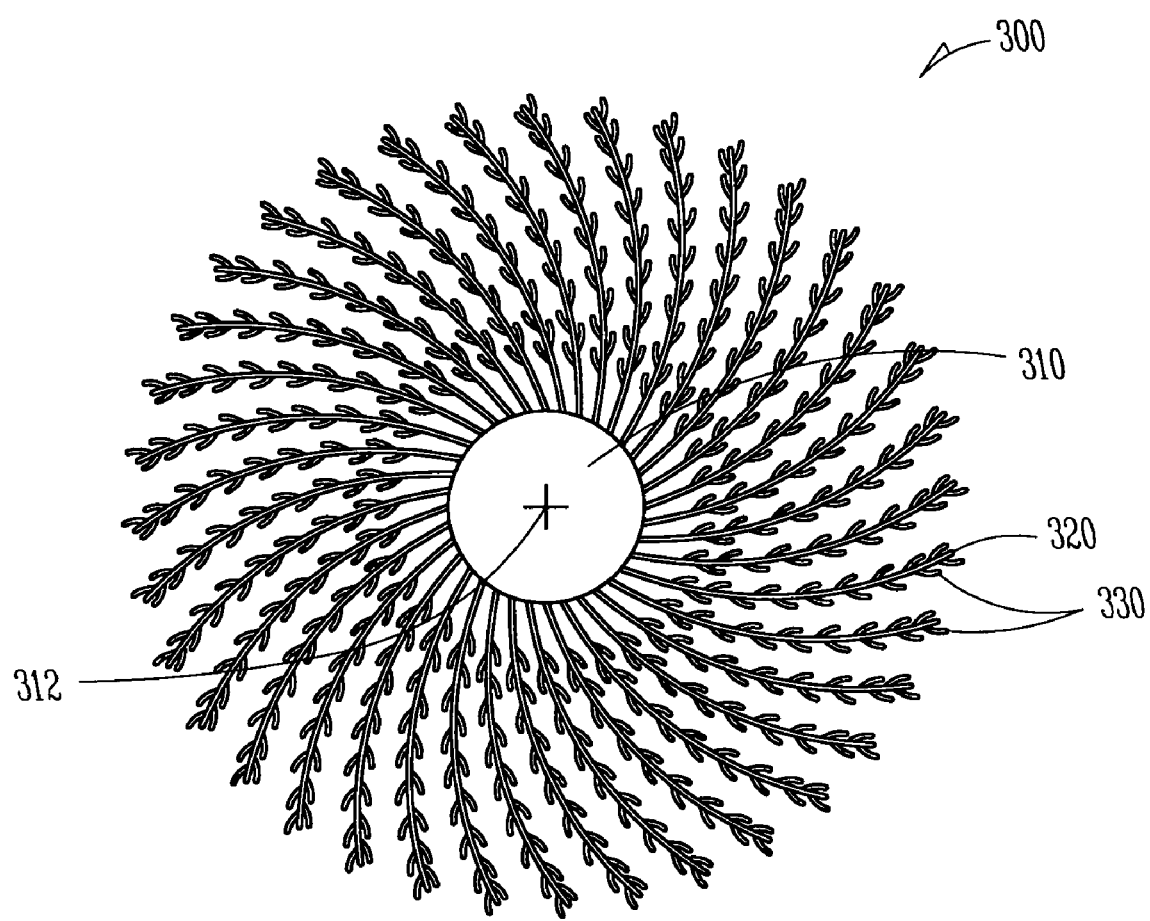
FIG. 3 illustrates a top view of a heatsink according to one embodiment of the invention.

FIG. 3 shows an embodiment of a heatsink 300. The heatsink 300 includes a base portion 310 with a number of heat transfer features 320 coupled to the base portion 310. In one embodiment, the number of heat transfer features 320 includes a number of fins. In one embodiment, the number of heat transfer features 320 are shaped in an arcuate shape as shown in FIG. 3. In one embodiment, the base portion 310 includes a center 312 and the number of heat transfer features 320 are arranged in a substantially radial pattern about the center 312. In one embodiment, the number of heat transfer features 320 are arranged with radial symmetry about the center 312, but the heat transfer features 320 themselves are not necessarily oriented radially.

A number of sub-features 330 are also shown. In one embodiment, a number of sub-features 330 are attached to at least one feature 320. In one embodiment, a number of sub-features 330 are attached to each heat transfer features 320. In one embodiment the number of sub-features 330 includes a number of sub-fins. One of ordinary skill in the art, having the benefit of the present disclosure will recognize that the term "fin" is a broad term that encompasses several geometries that are generally long and substantially flat. Fin geometries are not necessarily straight. For example, fins include arcuate shapes as shown in FIG. 3. One of ordinary skill in the art, having the benefit of the present disclosure will recognize that other geometries of heat conducting features apart from fins can also be used in embodiments of heatsinks as shown. In one embodiment, all edges of the heat transfer features 320 and the number of sub-features 330 are parallel to a longitudinal axis of the heatsink 300.

In one embodiment, features of the heatsink 300 are formed using a sintered powder manufacturing process. In one embodiment, the sintered powder manufacturing process includes powder metallurgy. In one embodiment, heat transfer features 320 and sub-features 330 are formed using a powder metallurgy process. In one embodiment, the base portion 310 is formed using a powder metallurgy process. In one embodiment, the base portion 310, the heat transfer features 320, and the sub-features 330 are formed integrally using a powder metallurgy process.

Figure 4:
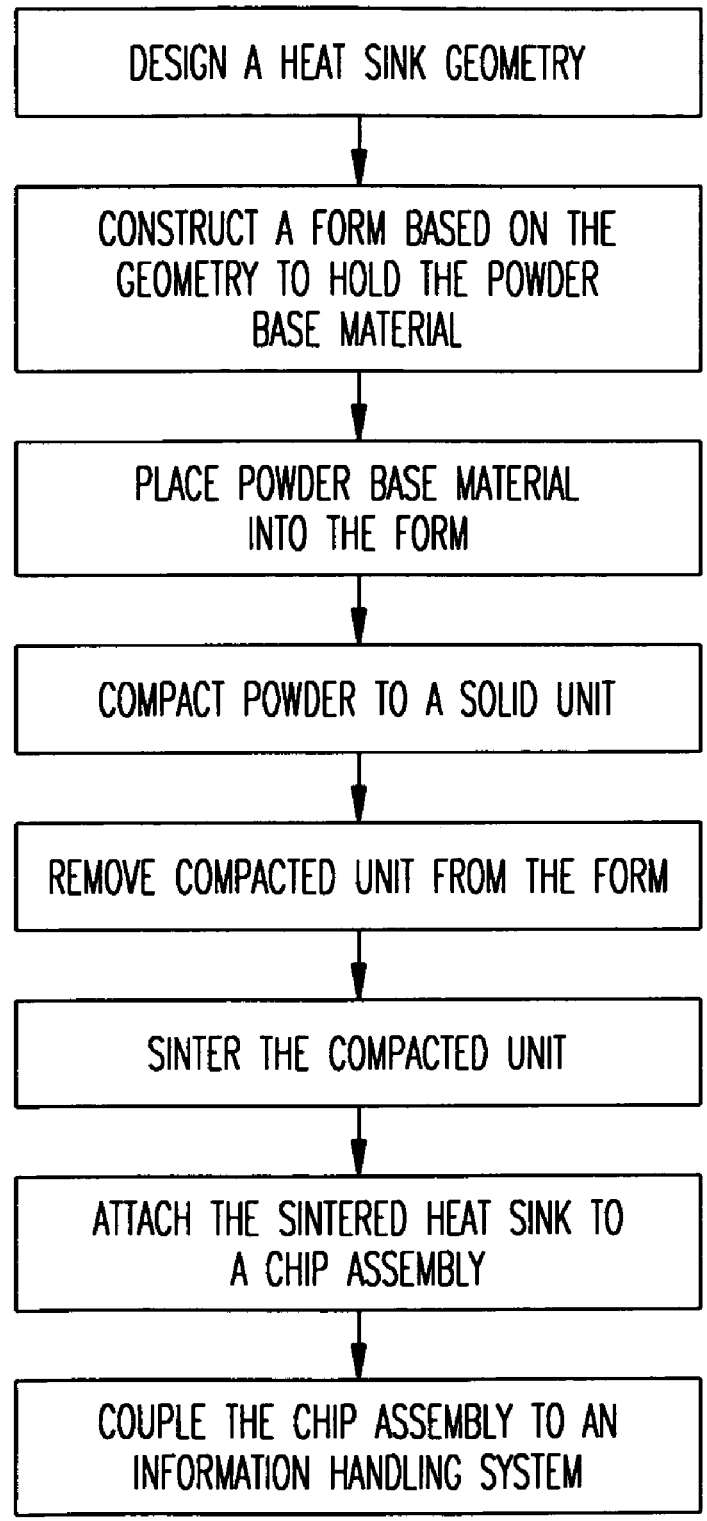
FIG. 4 illustrates a flow chart of a method of forming a heatsink according to one embodiment of the invention.

FIG. 4 shows a flow diagram of a method according to one embodiment used to form at least a portion of a heatsink using a powder metallurgy process. In one operation, a geometry for the heatsink is designed. In one embodiment, a computer aided design (CAD) program such as AutoCAD, ProE, etc. is used to design the geometry of the heatsink. In another operation, a form is constructed in a negative image of the heatsink. In one embodiment, the form is constructed using data from the CAD geometry of the heatsink.

In one embodiment a powder base material is placed within the form to substantially fill regions of the form that will become the eventual heatsink or heatsink component. In one embodiment, the powder base material is further compacted into the form under pressure from a piston, or other compression device to promote filling of detailed features in the form. Selected embodiments do not include compaction of the powder base material. Examples of powdered base material include, but are not limited to aluminum, copper, magnesium, etc. In one embodiment, a composite powder base material is used. Examples of composite powdered base material include, but are not limited to aluminum and aluminum oxide; copper and tungsten, etc. Although metal base materials are described, other base materials such as ceramic base materials are possible.

In one embodiment using compaction of the powder base material, a form is used that is open on opposing longitudinal ends. In one embodiment, the powder base material is compacted using a piston like device. In one operation, the compacted unit is held together temporarily from the pressing operation by mechanisms such as cold welds at the particle contact points or by the presence of a binder material additive in the powder base material. In one embodiment a lubricant is used in the powder base material to further promote compaction. In one embodiment, the compacted unit is then removed from the form prior to sintering. In one embodiment, the lubricant further aids in removal of the unit of pressed powder particles from the form. In one embodiment, the piston like device is further used to push the compacted unit out of the form through one of the open ends of the form.

In one operation the unit of pressed powder particles is sintered to transform the powder into a solid unit. In one embodiment temperatures below a melting temperature of the powder base material are used to sinter the powder base material. During one sintering operation, at a temperature below a melting temperature, powder particles diffuse together at contact points to form a solid connection between the individual powder particles. Processing conditions such as time, temperature, and sintering atmosphere are adjusted for sintering depending on the specific powder base materials being sintered.

One advantage of manufacture using powder metallurgy includes the fine surface finish of the unit directly after the sintering process. Other processes such as casting require additional manufacturing steps after the unit is formed. For example, cast parts require a machining operation after casting to remove unwanted protrusions left from the casting process.

Another advantage of manufacture using powder metallurgy includes the ability to form detailed features. Features with intricate detail such as sub-features 330 illustrated in FIG. 3 cannot be formed using other less detail capable processes such as casting or extrusion. In casting, problems such as removal of the cast part from a casting mold prohibit formation of intricate features. In contrast, in one embodiment using powder metallurgy, a component of a heatsink is compacted in a form, then pressed out of the form prior to sintering. Details such as sub-fins 330 are not broken off during removal of the unit of pressed powder particles from the form, and the intricate features are solidified during the sintering operation. Likewise, in an extrusion process, intricate features such as sub-fins 330 are broken or torn due to the forces needed to extrude the material through a die. No mechanical forces are used during a sintering operation of powder metallurgy.

Another advantage of manufacture using powder metallurgy includes the reduction of waste of raw materials. Because little or no machining is needed after formation of the heatsink or heatsink component, less material is wasted in the form of machining scraps.

In one embodiment a composition of a composite powdered base material is only possible using powder metallurgy techniques. Some heat sink materials may be incompatible with each other using manufacturing techniques such as casting. Elements of a composite material for a casting process may not melt together due to differing melting temperatures, or unwanted chemical phases may develop in a casting process. In contrast, powder metallurgy allows a wide range of composite materials that are not practical for formation using techniques such as casting.

Further, high melting temperature single component powders can also be formed using powder metallurgy techniques. For example, casting formation of components using metals such as refractory metals is not practical due to the extremely high temperatures necessary to melt refractory metals. Examples of refractory metals include tungsten, titanium, vanadium, etc. Because powder metallurgy does not require melting to form solid structures, powder metallurgy techniques can be uniquely used to form heatsink structures from selected metals such as refractory metals.

Likewise, high extrusion force materials can be formed using powder metallurgy techniques. Because powder metallurgy does not require extrusion forces to form solid structures, powder metallurgy techniques can be uniquely used to form heatsink structures from high hardness, or brittle materials that are difficult or impossible to extrude.

As shown in the flowchart of FIG. 4, in selected higher level applications, a sintered heatsink or heatsink component is further coupled to a device such as a chip assembly. Further, in one embodiment, a device such as a chip assembly including a sintered heatsink or heatsink component is further coupled into a system such as an information handling system.

Figure 5A:
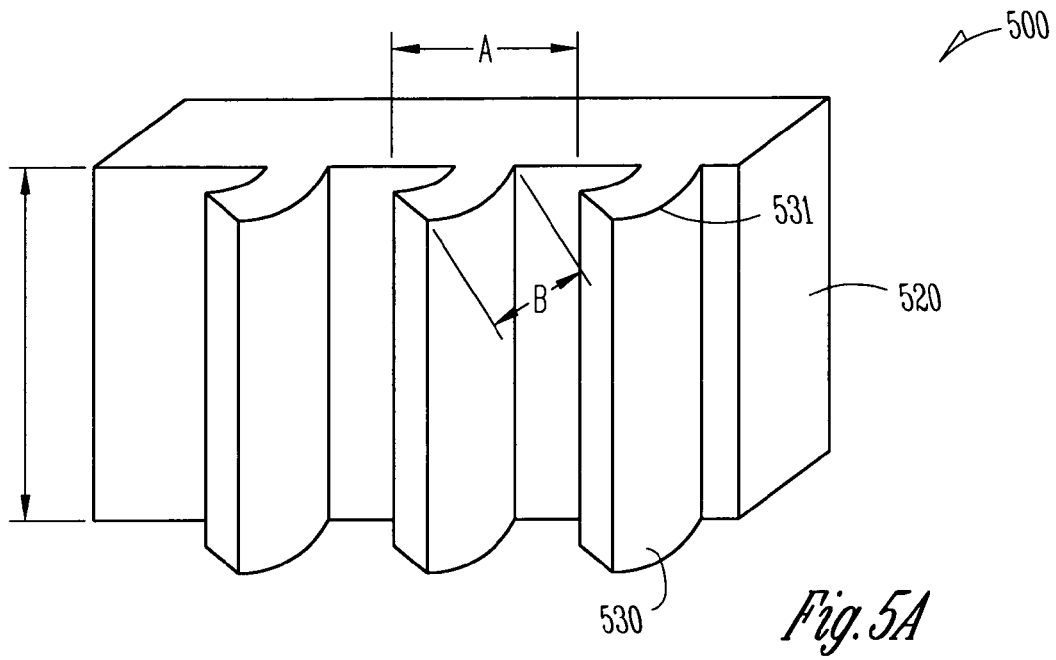
FIG. 5A illustrates an isometric view of a portion of a heatsink according to one embodiment of the invention.

FIG. 5A shows one configuration of a portion of a heatsink 500. The portion of the heatsink 500 includes a fin 520 and a number of sub-fins 530. One advantage of heatsink designs that use a number of sub-fins 530 includes increased surface area of the heatsink. As described above, several configurations of sub-fins 530 or sub-features cannot be formed using manufacturing methods such as casting or extrusion.

FIG. 5A illustrates one embodiment of geometry of the number of sub-fins 530. The following equations illustrate how the use of sub-fins 530 leads to a large increase in surface area of a resulting heatsink. In FIG. 5A:
  a is the length between the pitch in the fin
  b is the height of the sub-fin
  c is the width of the fin.
  The surface area per pitch without the sub-fin, $A = c \times a$
  The surface area per pitch with the sub-fin, $A' = c \times a + 2(b \times c)$
  The percentage of the increase in surface area, $$\% \, \Delta \text{Area} = \frac{A' - A}{A} \times 100 = \frac{2 \times (b \times c) + c \times a - c \times a}{c \times a} \times 100 = \frac{2b}{a} \times 100$$

If b=0.5a, then, the percentage of the increase in surface area will be 100%.

Given that heat dissipation, $H_d \, \alpha \, \text{Area}_{surface}$ the increase in the surface area increases heat dissipation efficiency.

Although specific examples of dimensions a, b, and c are given above, the values are intended only as an example. Likewise, although the sub-fins 530 include an arcuate profile 531 to enhance surface area in a given volume, other geometries of sub-fins or sub-features are also within the scope of the invention.

Figure 5B:
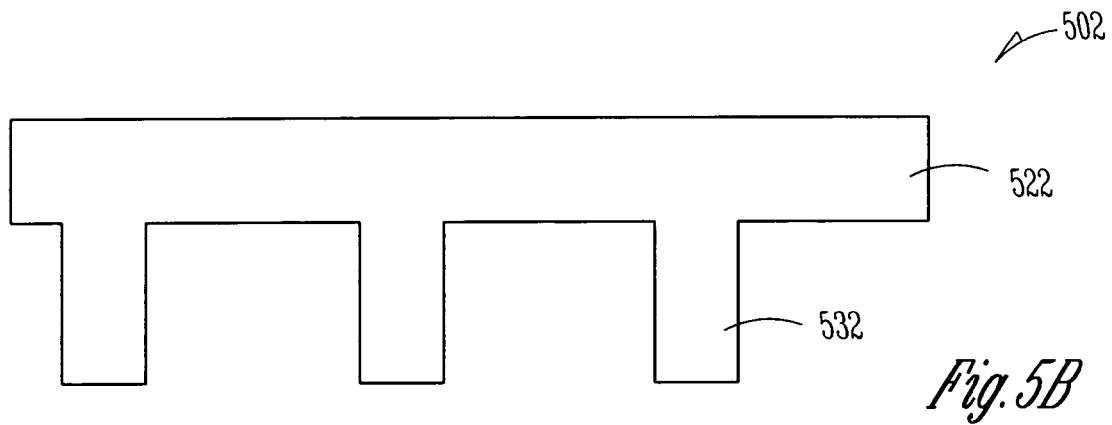
FIG. 5B illustrates a top view of a portion of a heatsink according to one embodiment of the invention.
Figure 5C:
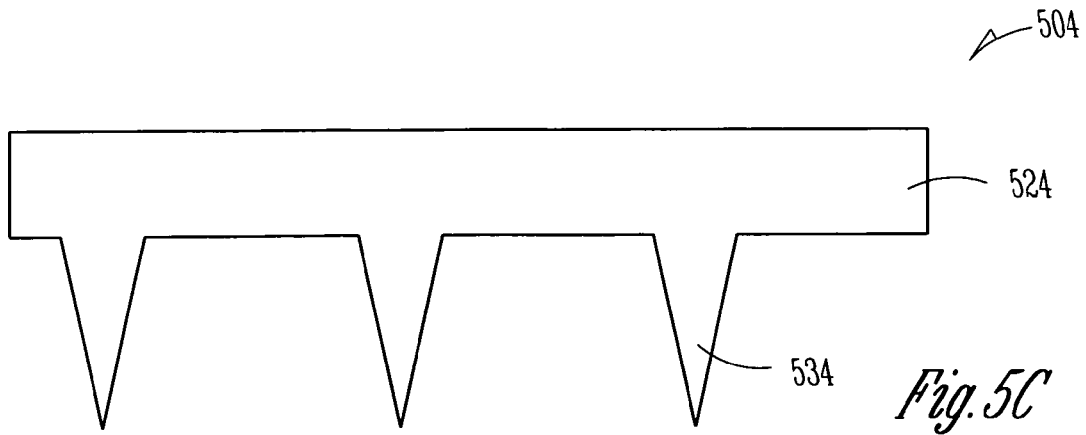
FIG. 5C illustrates a top view of a portion of a heatsink according to one embodiment of the invention.

FIG. 5B shows an example of a portion of a heatsink 502. The portion of the heatsink 502 includes a fin 522 and a number of sub-fins 532. In one embodiment, the sub-fins 522 include a number of rectangular sub-fins. FIG. 5C likewise illustrates an example of a portion of a heatsink 504. The portion of the heatsink 504 includes a fin 524 and a number of sub-fins 534. In one embodiment, the sub-fins 522 include a number of triangular sub-fins.

Figure 6:
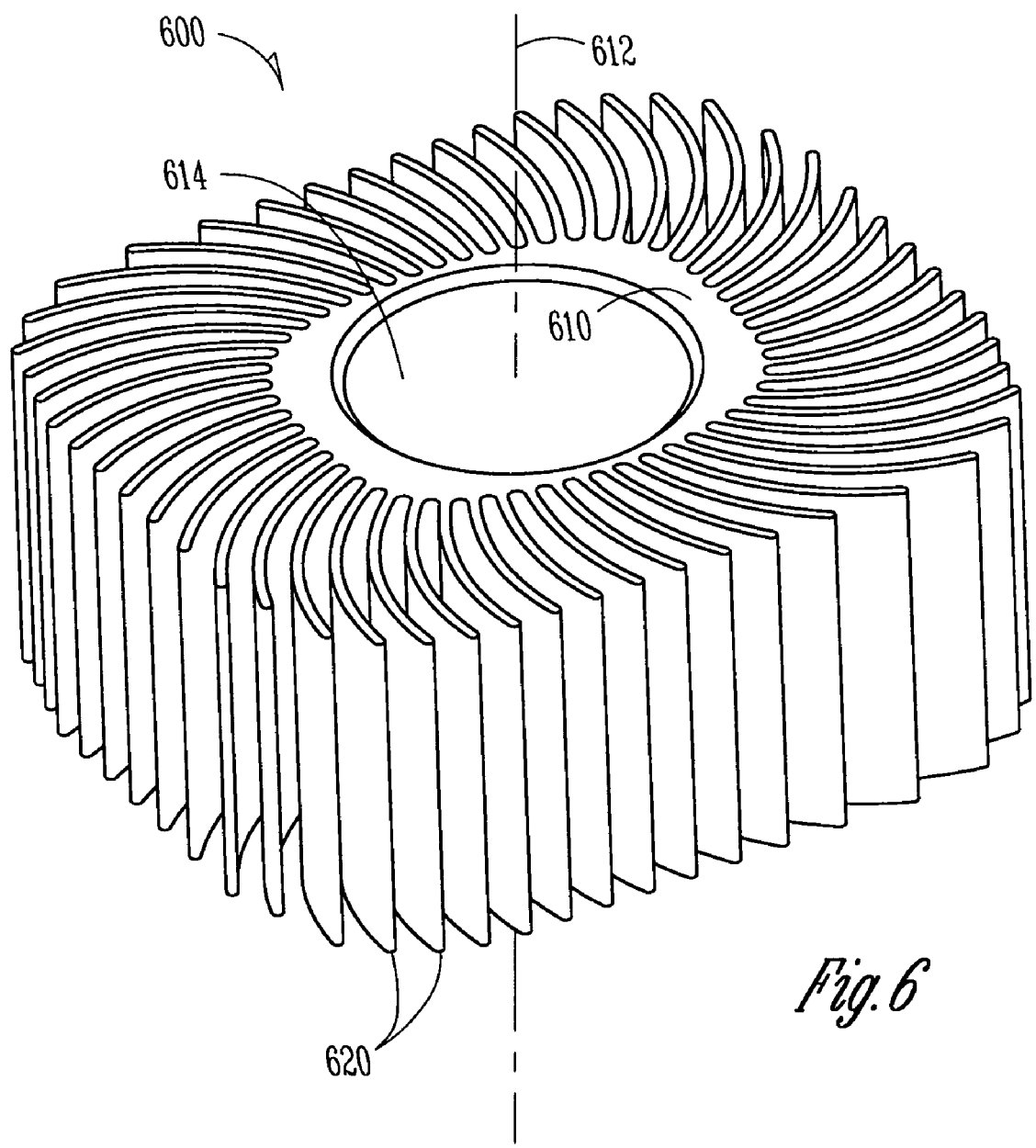
FIG. 6 illustrates an isometric view of a heatsink according to one embodiment of the invention.

FIG. 6 shows an embodiment of a heatsink 600. The heatsink 600 includes a base portion 610 with a number of heat transfer features 620 coupled to the base portion 310. In one embodiment, the number of heat transfer features 620 includes a number of fins. In one embodiment, the number of heat transfer features 620 are shaped in an arcuate shape as shown in FIG. 6. In one embodiment, the base portion 610 includes a center 312 and the number of heat transfer features 620 are arranged in a substantially radial pattern about the center 612. In one embodiment, the number of heat transfer features 620 are arranged with radial symmetry about the center 612, but the heat transfer features 620 themselves are not necessarily oriented radially. In one embodiment, all edges of the heat transfer features 620 are parallel to a longitudinal axis of the heatsink 300.

In one embodiment, heat transfer features 620 are formed using a powder metallurgy process as described in embodiments above. In one embodiment, the base portion 610 is formed using a powder metallurgy process as described in embodiments above. In one embodiment, at least part of the base portion 610 and the heat transfer features 620 are formed integrally using a powder metallurgy process as described in embodiments above.

In one embodiment the number of heat transfer features 620 located about the base portion 610 can be increased due to the use of powder metallurgy techniques as described in embodiments above. Powder metallurgy provides capabilities to increase the number of heat transfer features 620 similar to capabilities needed to form numbers of sub-features as described above.

In one embodiment, the base portion 610 includes an insert 614 within a part of the base portion 610. In one embodiment, the insert 614 includes a material of a different composition from the remaining base portion 610 or number of heat transfer features 620. In one embodiment, the insert 614 includes a material with a higher thermal conductivity than the remaining base portion 610 or number of heat transfer features 620. In one embodiment, the insert 614 includes copper. Factors for selection of the material and geometry for the insert 614 include thermal performance, weight, and cost for the thermal solution. One advantage of a composite heatsink 600 using an insert 614 includes the ability to achieve high thermal conductivity in the insert 614 using materials such as copper, while maintaining a low weight and low cost using other materials such as aluminum for the number of heat transfer features 620.

Methods of forming heatsinks as described above include advantages such as the ability to produce intricate detailed features that other manufacturing methods are not capable of. Other advantages include a reduction in process time and cost due to the absence of a need to machine components after initial fabrication. Embodiments of devices formed by the methods described above include features such as sub-fins and other detailed features that cannot be formed using other manufacturing processes. Further embodiments of devices formed by the methods described above include materials that cannot be formed using other manufacturing processes.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments described above. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming an information handling system, comprising:
    forming a processor assembly including:
        attaching a processor chip to a substrate;
        coupling a package cover to the processor chip;
        forming a heatsink, including:
            constructing a heatsink form with a number of heatsink forming features and two opposing open ends;
            placing an amount of powder into the heatsink form;
            heating the amount of powder to a sintering temperature;
            sintering the powder to form a bond between powder particles in the powder;
            removing a heatsink unit from the heatsink form by pressing the heatsink unit out of the heatsink form through one of the open ends of the heatsink form, the heatsink unit being formed from the sintered powder;
        coupling the heatsink unit to a surface of the package cover; and
    connecting a bus between the processor chip and a dynamic random access memory.

2. The method of claim 1, wherein constructing the heatsink form includes constructing a heatsink form with features for forming a number of radial fins.

3. The method of claim 1, wherein constructing the heatsink form includes constructing a heatsink form with features for forming a number of radial fins and a number of sub-fins attached to at least one of the number of radial fins.

4. The method of claim 1, wherein placing the amount of powder into the heatsink form includes placing an amount of metal powder into the heatsink form.

5. The method of claim 1, wherein connecting a bus between the processor chip and a dynamic random access memory includes connecting a bus between the processor chip and a double data rate dynamic random access memory.

6. A method of forming an information handling system, comprising:
    forming a processor assembly including:
        attaching a processor chip to a substrate;
        coupling a package cover to the processor chip;
        coupling a heatsink unit to a surface of the package cover, wherein at least a portion of the heatsink is formed using powder sintering techniques using a heatsink form with a number of heatsink forming features and two opposing open ends and removing the heatsink from the heatsink form by pressing the heatsink out of the heatsink form through one of the open ends of the heatsink form; and
    connecting a bus between the processor chip and a dynamic random access memory.

7. The method of claim 6, wherein coupling the heatsink unit includes coupling a heatsink unit to a surface of the package cover, wherein at least a portion of the heatsink is formed using metal powder sintering techniques.

8. The method of claim 6, wherein coupling the heatsink unit includes coupling a heatsink unit to the surface of the package cover, wherein the heatsink unit includes a number of radial fins and a number of sub-fins attached to at least one of the number of radial fins.

* * * * *